United States Patent [19]

Sprague

[11] Patent Number: 4,833,718

[45] Date of Patent: May 23, 1989

[54] COMPRESSION OF STORED WAVEFORMS FOR ARTIFICIAL SPEECH

[75] Inventor: Richard P. Sprague, Westminster, Calif.

[73] Assignee: First Byte, Los Angeles, Calif.

[21] Appl. No.: 13,966

[22] Filed: Feb. 12, 1987

Related U.S. Application Data

[63] Continuation-in-part of Ser. No. 932,165, Nov. 18, 1986.

[51] Int. Cl.⁴ .............................................. G10L 5/00
[52] U.S. Cl. ....................................... 381/52; 381/31; 381/35
[58] Field of Search .................................. 381/29–53; 379/88, 196, 211; 382/56; 358/263, 136, 283

[56] References Cited

U.S. PATENT DOCUMENTS

| | | | |
|---|---|---|---|
| 4,382,160 | 5/1983 | Goslung et al. | 381/31 |
| 4,692,941 | 9/1987 | Jacks et al. | 381/52 |
| 4,703,505 | 10/1987 | Seiler et al. | 381/51 |
| 4,709,340 | 11/1987 | Capizzi | 381/51 |
| 4,718,087 | 1/1988 | Papamichalis | 381/34 |
| 4,730,348 | 3/1988 | MacCriskin | 364/200 |

Primary Examiner—Emanuel S. Kemeny
Attorney, Agent, or Firm—Weissenberger & Peterson

[57] ABSTRACT

In a digital text-to-speech conversion system of the type usually contained in all-software form on a floppy disk, memory requirements for the storage of digitized waveform samples are reduced while speech quality is improved, by providing compression techniques and anti-distortion techniques which interact to provide clear speech at widely varying speeds with a minimum of memory. These techniques include using Huffman coding of first- or second-order differences, encoding only differences between successive waveforms where feasible, using a demi-diphone organization of the speech to allow use of the same instruction lists for several sounds, selectively deleting or repeating waveforms in the concatenation to vary speed without affecting pitch, and encoding waveforms linearly or anti-logarithmically for storage while converting the stored linear or anti-logarithmic codes to logarithmic codes such as $\mu$-law codes upon retrieval.

3 Claims, 9 Drawing Sheets

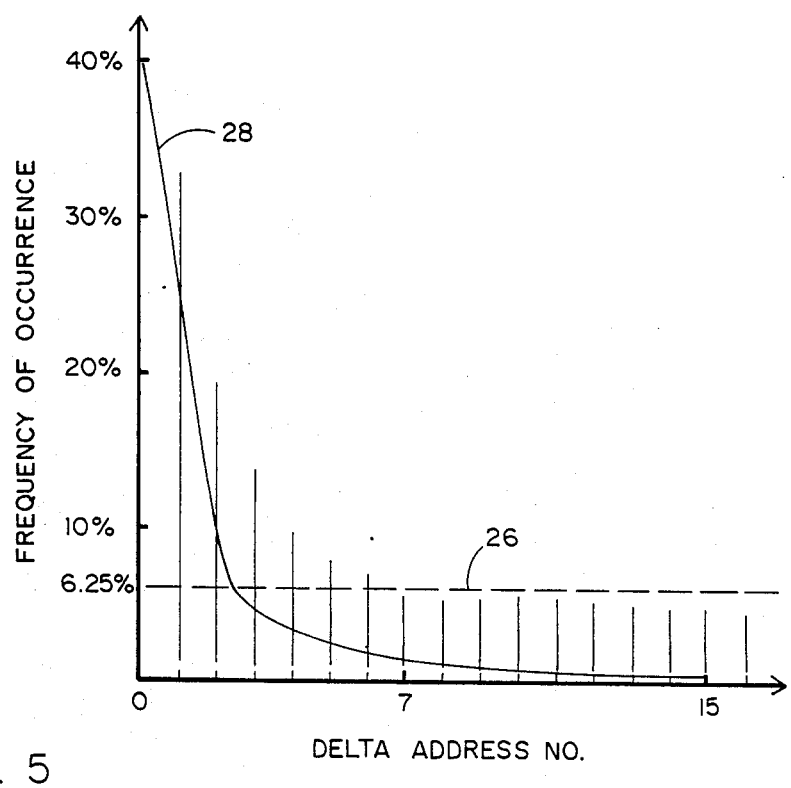
FIG. 5
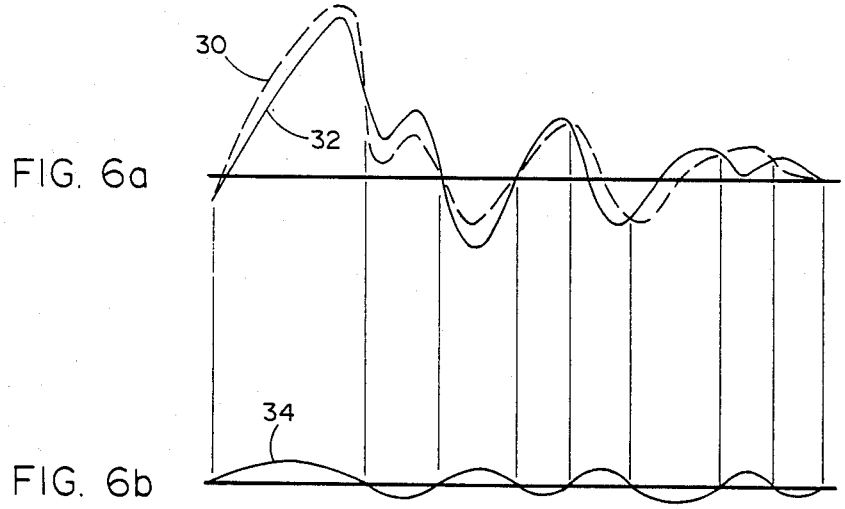
FIG. 6a
FIG. 6b

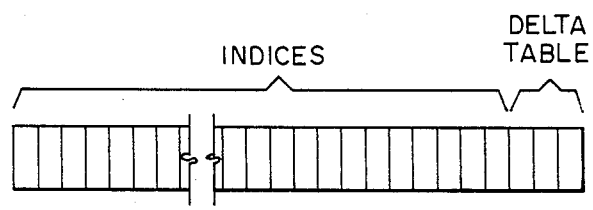
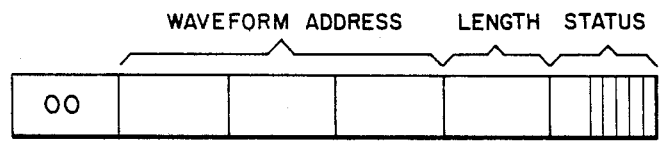
FIG. 7
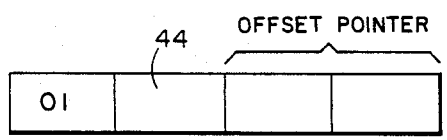
FIG. 8a
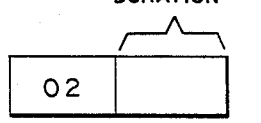
FIG. 8b
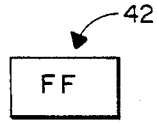
FIG. 8c
FIG. 8d

FIG. 9a
PRIOR ART

| Silence to r | r | r to IH | IH | IH to t | t | t to SH | SH | SH to ER | ER | ER to silence |
|---|---|---|---|---|---|---|---|---|---|---|

FIG. 9b

| Silence to r | r to IH | IH to t | t to SH | SH to ER | ER to silence |
|---|---|---|---|---|---|

FIG. 9c

| Left silence to r | Right silence to r | Left r to IH | Right r to IH | Left IH to t | Right IH to t | Left t to SH | Right t to SH | Left SH to ER | Right SH to ER | Left ER to silence | Right ER to silence |
|---|---|---|---|---|---|---|---|---|---|---|---|

COMPRESSION OF STORED WAVEFORMS FOR ARTIFICIAL SPEECH

Related Cases

This case is a continuation-in-part of my copending application Ser. No. 932,165 filed Nov. 18, 1986 and also entitled COMPRESSION OF STORED WAVEFORMS FOR ARTIFICIAL SPEECH.

FIELD OF THE INVENTION

This invention relates to the compression of digitized waveforms, and more particularly to the reduction of storage requirements for speech elements in software used in the production of artificial speech.

BACKGROUND OF THE INVENTION

Copending application Ser. No. 598,892 filed April 1984 and entitled "Real-Time Text-To-Speech Conversion System" discloses a text-to-speech conversion system in which digitized waveforms representing constituents of speech are stored in a random access memory, and are assembled into phonemes and transitions under the control of a program which reads computer-formatted text and determines therefrom which stored waveforms are to be used, and in what manner, to create spoken words corresponding to the text.

A major problem in using all-software text-to-speech conversion programs in personal computers is the inadequacy of available memory for high-quality speech production. Consequently, it is necessary to compact the stored waveforms so that a great deal of waveform data can be stored in a small amount of random access memory.

In addition to using the compaction-methods described in Ser. No. 598,892, it has previously been proposed to compress digitized waveforms by an "optimal delta" compression technique illustrated in U.S. Pat. No. 4,617,645. This technique is reasonably efficient, but it introduces a slight amount of distortion into the re-created analog waveform.

Although these methods were satisfactory in early text-to-speech conversion products, the continuing need for ever more natural-sounding artificial speech has made it necessary to develop more powerful compression methods in order not only to store more digitized waveforms within the limits of available memory, but also to reduce the amount of program memory involved in assembling the stored waveforms to produce speech.

SUMMARY OF THE INVENTION

The present invention achieves considerably improved compaction by combining a number of novel compaction methods in the storage, retrieval, and processing of digitized waveforms to produce speech.

To begin with, in accordance with the invention, the number of bits needed to encode each sample of the digitized stored waveforms in accordance with the teachings of Ser. No. 598,892 is reduced by the use of Huffman coding of first or second order differences between samples.

Secondly, a substantial amount of memory is saved by storing, for successive pitch periods of vowels, not the actual waveform for each pitch period but the differences between the waveform for a given pitch period and the waveform for the preceding pitch period. Because the differences between such waveforms is quite small, Huffman coding is particularly effective in this situation.

Thirdly, storage of silence periods in waveforms is reduced by merely storing a number indicating the number of zero-amplitude samples to be used.

Fourthly, additional compaction may be achieved (albeit at a small cost in quality) by the use of $\mu$-law companding.

Fifthly, the need for program memory is substantially reduced by breaking each diphone of the speech into left and right demi-diphones. Although this would appear at first glance to require the storage, in the program, of twice as many waveform processing instructions, so many demi-diphones have been found to be interchangeable with one another that the total program storage requirement for demi-diphones is substantially less than for diphones.

Sixthly, the harmonic distortion caused by the concatenation of waveform segments (as in the compression technique of using consecutive repetitions of a short components waveform to produce a single sound) whose initial and final amplitudes do not match is greatly reduced by ramping the initial or terminal portion of each waveform to produce an amplitude match with the next waveform at their interface.

Seventhly, the speed of the speech is controlled without affecting the pitch by the selective repetition or depletion of individual waveforms during the concatenation of waveforms to produce a speech signal.

It is the primary object of the invention to produce an improved speech quality in digital text-to-speech conversion systems while reducing the need for random-access memory in the system, yet minimizing computation time.

It is another object of the invention to achieve improved compaction of digitally stored waveforms by a novel organization of the stored information, by the use of Huffman coding of first- or second-order differences between samples, by storing waveform differences rather than waveforms, and by optionally using $\mu$-law companding.

It is a further object of the invention to achieve additional economies in waveform storage by controlling the speed of speech delivery through periodic deletion or repetition of waveforms during concatenation, and by numerically encoding periods of silence.

It is still another object of the invention to reduce the program memory requirements in a text-to-speech conversion system of the type described, by operating on demi-diphones instead of diphones.

It is a still further object of the invention to improve the quality of artificial speech generated from compressed digitized waveforms by using ramping techniques to minimize the harmonic distortion produced by the concatenation of non-matching waveform segments.

BRIEF DESCRIPTION OF THE DRAWINGS

FIG. 5 is a diagram illustrating the applicability of Huffman coding;

FIG. 6a is a time-amplitude diagram showing a pair of similar waveforms;

FIG. 6b is a time-amplitude diagram showing the waveform representing the difference between the two waveforms of FIG. 6a;

FIG. 7 shows a segment block; similar to FIG. 3 but showing the four types of segment blocks used in the invention;

FIGS. 8a through 8d are diagrams illustrating μ-law, linear, and anti-logarithmic encoding, respectively;

FIG. 9a is a block diagram illustrating the phoneme-and-transition method of organizing speech;

FIG. 9b is a block diagram illustrating the diphone method of organizing speech;

FIG. 9c is a block diagram illustrating the demi-diphone method of organizing speech;

FIG. 10b through d are time-amplitude diagrams illustrating various types of ramping signals;

FIG. 11c is a flow chart illustrating the decision-making program for the system of FIG. 11a.

FIGS. 12a-12d, 13a-13d, 14a-14c, 15 and 16 show further processing details.

DESCRIPTION OF THE PREFERRED EMBODIMENT INTRODUCTION

Figure 1:
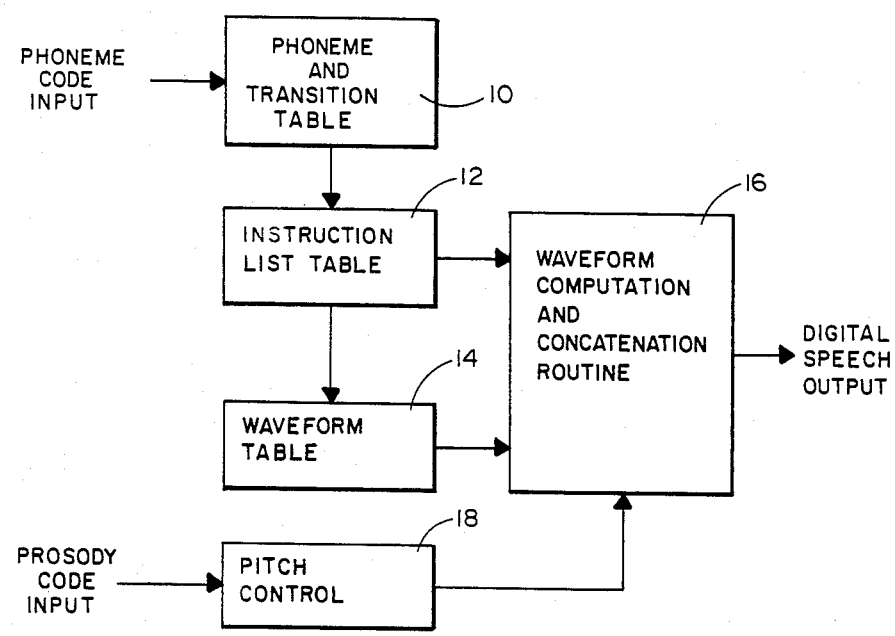
FIG. 1 is a block diagram of the portion of the system of copending application Ser. No. 598,892 which is relevant to the present invention.
Figure 2:
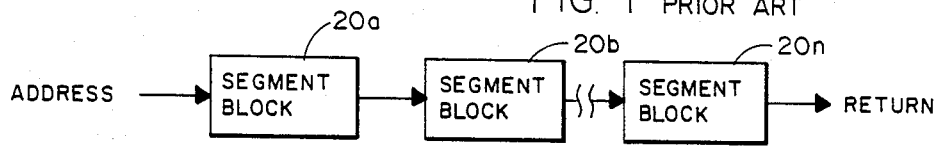
FIG. 2 is a detail block diagram of the instruction list table of FIG. 1.
Figure 3:
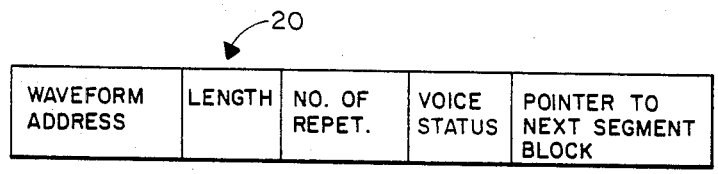
FIG. 3 is a detail block diagram of a typical segment block of FIG. 2.

FIGS. 1 through 3 illustrate, in general outline, the speech generation portion of the text-to-speech conversion system of copending application Ser. No. 598,892, which the present invention improves.

Information regarding what speech sounds to generate, and at what pitch, is supplied to the system of FIG. 1 in the form of a sequence of phoneme codes and corresponding prosody codes. The phoneme codes are applied to a phoneme and transition table 10 which selects an appropriate instruction list from the instruction list table 12 to produce a given phoneme or transition. The instruction list in turn selects appropriate digitized waveforms from the waveform table 14 and feeds them to the waveform computation and concatenation routine 16 which produces a continuous digital sample stream under the control of the instruction list and the pitch control 18. The pitch control 18 is in turn controlled by the prosody codes. This sample stream is the digital speech output which can be converted to audible speech by a digital-to-analog converter or by other techniques not material to this invention.

As shown in FIG. 2, each instruction list consists of a series of segment blocks 20a through 20n. The first segment block 20a is addressed by the phoneme and transition table 10, and the last segment block 20n returns control to the phoneme and transition table 10 for the generation of the next phoneme or transition.

In the system of Ser. No. 598,892, each segment block 20 contained five pieces of information: (1) the address of a specific waveform in the waveform table 14; (2) the length of that waveform (i.e. The number of digitally encoded samples defining it); (3) the number of successive repetitions of that waveform to be generated; (4) the voice status (i.e. whether the phoneme being generated was voiced or unvoiced); and (5) the address of the next segment in the list (or, in the last segment 20c, a return instruction).

Figure 4:
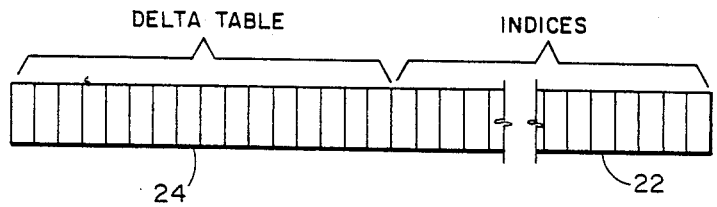
FIG. 4 is a detail diagram illustrating the data organization of a digitized waveform as stored in the waveform table of FIG. 1.

In accordance with U.S. Pat. No. 4,617,645, the waveforms were encoded in the system of Ser. No. 598,892 by storing one four-bit index for each waveform sample (i.e. two indices per byte) in the index bytes 22 (FIG. 4), and sixteen eight-bit delta values in the sixteen delta table bytes 24. The indices and delta values together defined a waveform as described below.

In the above-described environment, the present invention provides techniques for substantially reducing the memory requirements (typically on a floppy disc) for the table 10, 12 and 14 while improving the quality of the speech which can be generated by the system of FIG. 1, and for doing so with a spring use of the computer's computing power.

1. Huffman coding

The "optimal delta" compression technique of U.S. Pat. No. 4,617,645, although theoretically capable of producing a nearly 50% compaction, produced an actual compaction of only about 24% to 38% in various practical application. Furthermore, it did so by using approximations which introduced a slight amount of distortion in the reconstructed waveform.

A much more effective method of compression, which at the same time preserves the full accuracy of the waveform, is the use of Huffman coding, i.e. a coding method in which waveform sample values are defined by codes having a non-uniform number of bits. Huffman coding in accordance with the invention is based on the recognition that low absolute sample values occur much more frequently in speech signals than do high absolute sample values. By encoding the most common sample values with short codes and the more rare ones with longer codes, the total number of bits required to encode a large number of samples is considerably less than the number of bits required to encode the same samples with a constant-length code.

The Huffman coding technique assigns bit encodings to sample values according to the formula:

$$H = -\log_2 p$$

where H is the length of the code in bits, and p is the relative frequency of occurrence of the sample. H, in the above formula, is a real number rounded to a nearby (though not necessarily the nearest) integer.

Suppose that a particular waveform had the following (ideal) distribution of sample values in the range −128 to 127, which are digitally expressible by 8-bit codes:

| sample value | frequency | |
|---|---|---|
| −128 ... −65 | 1/1024 | $(2^{-10})$ |
| −64 ... −33 | 1/512 | $(2^{-9})$ |
| −32 ... −17 | 1/128 | $(2^{-7})$ |
| −16 ... 15 | 1/64 | $(2^{-6})$ |
| 16 ... 31 | 1/128 | $(2^{-7})$ |
| 32 ... 63 | 1/512 | $(2^{-9})$ |
| 64 ... 127 | 1/1024 | $(2^{-10})$ |

According to the above formula, the samples would be assigned 6-bit, 7-bit, 9-bit, and 10-bit codes. The average code size would be (1/64 * 32 * 6)+(1/128 * 32 * 7)

(1/512*+64*9)+(1/1024*128 *10)=7.125 bits, resulting in a compression of less than 11%.

This is not in itself a great deal of compression. However, the Huffman technique works best with data where the relative frequencies are highly mal-distributed.

FIG. 5 shows the distribution of sample values which makes the Huffman coding practical. If the distribution is totally uniform (dotted line 26), Huffman coding is of no value. If the distribution is strongly skewed (solid curve 28), about 75% of all samples might be encoded by the shortest code, 17% by a medium-length code, and 8% by a long code. This can be accomplished by storing not the sample value itself, but the difference between a given sample and the previous sample.

Using such first-order differences between samples (known as differential pulse code modulation or DPCM) produces a high degree of maldistribution. The original waveform is re-created by adding a stored current delta value to the previously-derived sample. Experience shows an average reduction of 4:1 in the average amplitude of these deltas over the average amplitude of the original waveform.

In many cases, even more compression is achievable by using second-order differences between samples. A second-order difference is simply the difference between successive first-order differences between samples. The current sample is computed summing the linear extrapolation of the previous two samples with the current second-order delta according to the formula $$C = 2b - a + e_i$$

where
C = current sample
b = preceding sample
a = second preceding sample
$e_i$ = instantaneous error factor By storing only $e_i$ for each sample, all samples can be fully and accurately computed. The following (ideal) table represents roughly the degree of mal-distribution achievable through delta strategies:

| deltas: | frequencies: | |
|---|---|---|
| −128 ... −65 | 1/8192 | $(2^{-13})$ |
| −64 ... −33 | 1/4096 | $(2^{-12})$ |
| −32 ... −17 | 1/1024 | $(2^{-10})$ |
| −16 ... −9 | 1/256 | $(2^{-8})$ |
| −8 ... −5 | 1/64 | $(2^{-6})$ |
| −4 ... −3 | 1/16 | $(2^{-4})$ |
| −2 ... 1 | 1/8 | $(2^{-3})$ |
| 2 ... 3 | 1/16 | $(2^{-4})$ |
| 4 ... 7 | 1/64 | $(2^{-6})$ |
| 8 ... 15 | 1/256 | $(2^{-8})$ |
| 16 ... 31 | 1/1021 | $(2^{-10})$ |
| 32 ... 63 | 1/4096 | $(2^{-12})$ |
| 64 ... 127 | 1/8192 | $(2^{-13})$ |

The average size of Huffman codes based upon using this table would be (1/8*4*3)+(1/16*4*4)+(1/64*8*6)+(1/256*16*8)+(1/1024*32*10)+(1/4096*64*12)+(1/8192*128*13)=4.8 bits, result about 40%.

Whether to use first- or second-order deltas, and whether or not to re-create the current segment by adding deltas to the previous segment as described below is a decision best made on a segment-by-segment basis. There is far less time-domain redundancy in (voiced and unvoiced) fricative and plosive sounds than in vowel sounds, for example. For such sounds, the deltas between successive segments are generally higher in amplitude than the original segment samples. Taking first-order differences between samples is marginally better, but second-order differences are worse. The best strategy is to store deltas for whichever of the four possible combinations yields the best compression, and store two bits in the segment block corresponding to that segment, so as to indicate which combination of techniques was chosen to create the stored deltas.

Another consideration is how to translate Huffman codes back into the values they represent. Since speech synthesis algorithms tend to be computationally intensive, the decompression algorithm should be as time-efficient as possible, even at the expense of some space inefficiency. Where Hmax is the length of the longest Huffman code, a look-up table of length $2^{Hmax}$ bytes (all but 256 of its entries redundant) is the fastest way to compute the original value. A second lookup-table of the same length is needed to store the size (in bits) of the code, so the algorithm will know how many bits to skip to get to the next code. However, an empirical calculation shows that some delta values are so rare that a suitable Huffman code for them may be as much as 18 bits long. This would require impossibly large lookup-tables, quite aside from the fact that few personal computer microprocessors can handle 18-bit indexing.

A solution to this problem is to fix Hmax at 8, thereby requiring only 512 bytes of look-up tables per Huffman encoding. All Huffman codes with a length greater than 8 are forced to be 16 bits long. The first 8 bits of their encoding will index a reserved value which will indicate that the actual value is contained in the second 8 bits of the code. This space "de-optimization" costs only about 3% of the total amount of compression, but maintains the essential time-efficiency of the decompression process.

The next problem to be considered in the use of Huffman codes is how many sets of codes to use. Clearly, each speech segment cannot have its own encoding since the overhead (512 bytes) is greater than any of the individual speech segments. At the other extreme, if only one code set is used for all segments, then that set will have to represent the average distribution of deltas for all segments combined, and it will not be well matched to any particular speech segment.

A reasonable compromise is to divide the speech segments into $M = 2^x$ classes, according to their ability to be compressed using Huffman coding. Then, the delta populations for all members of the same class are summed and a single Huffman encoding is computed for members of that class. An x-bit value in the list elements for those members indicates membership in that class so that the decompression algorithm will select the correct look-up tables. The number of classes should be such that the gain in compression is not offset by the overhead of 512 bytes per class for decompression. In the preferred embodiment, as a result of empirical research, 4 classes, (i.e. x=2) have been chosen.

2. Compression by storing waveform differences

The production of vowel sounds in artificial speech frequently involves the concatenation of two waveforms which differ only slightly from one another, as illustrated by waveforms 30, 32 in FIG. 6a. Further compression can therefore be achieved on voiced sounds by storing the sample-by-sample differences (curve 34, FIG. 6b) between two adjacent pitch periods of the voiced sound. In the quasi-stationary part of the voiced phoneme, the differences from one pitch period to the next are quite minimal; storing these differences instead of the original samples permits the use of Huffman encodings that are particularly space-efficient because the mal-distribution of deltas is exacerbated in this situation. In the routine 16 (FIG. 1), the second waveform is computed by saving the first waveform and adding the differences to it on a sample-by-sample basis. Even further compression can be achieved by encoding first- or second-order differences between the original difference values as described above.

If the original waveform and the waveform to be computed by this process are of different lengths, the shorter one is assumed, for calculation purposes, to be padded with a sufficient number of terminal zeros to match the length of the longer one. The first waveform used by the first segment block of an instruction list is, of course, encoded directly rather than as a difference. In the instruction string of Ser. No. 598,892, which establishes the order in which the stored waveforms are to be fetched, a flag can be set to indicate whether a given stored waveform is to be read directly or as a difference from the next preceding waveform.

In the use of this compression technique, it is advantageous to pre-compute the demarcation of one pitch period to the next off-line in such a manner as to minimize the average sample-to-sample difference.

3. Variable segment blocks for sounds and silence

In the improved system of this invention, four different kinds of segment blocks 36, 38, 40, 42, illustrated in FIGS. 7a through 7d, are provided in place of the segment block 20 of FIG. 3. The segment block 36 of FIG. 7a, which corresponds most closely to segment block 20 and is associated with a specific sound waveform, may be identified by a hexadecimal 00 in the first byte. The next three bytes contain the address of the waveform in the waveform table 14, and the fifth byte contains the number of samples in the stored waveform. The sixth byte is the status byte. It contains a voice status bit 35; a difference flag 37 indicating whether the addressed waveform is an original waveform or the difference from the preceding waveform; a two-bit class code 39, indicating which Huffman code set was used in generating the sample codes; and a delta-order flag 41 indicating whether the stored code is a first- or second-order code. Optionally, a prediction flag 43 may be used to indicate whether the encoded value is an absolute sample value or a first- or second-order linear prediction value. The remaining bits may be used for other control functions.

In the list organization of this invention, successive segment blocks are always stored in sequence. Hence, the next-segment pointer in the block 20 of FIG. 3 is unnecessary.

A second type of segment block 38 is illustrated in FIG. 7b. This type of segment block functions as a sublist pointer and may be used to access another instruction list (or a trailing portion thereof) as a subroutine. The sublist pointer 38 may be identified by a hexadecimal 01 in the first byte. In the preferred embodiment, the identification byte may be followed by a blank byte 44 (for coding reasons) and a two-byte offset pointer identifying the start of the sublist in the instruction list table.

A third type of segment block 40 is used as a silence block. Unvoiced stops account for 25-50% of all running speech Prior to the present invention, unvoiced stops were treated and stored as components of waveforms or waveforms consisting of zero-value samples. In accordance with the present invention, a special segment block 40 (FIG. 7c) is instead inserted into the instruction list defining a particular phoneme or transition. This special silence block does not fetch any waveform, but instead directly generates a string of zero-value samples. The length of the string (in milliseconds) is encoded into the silence block. Considerable economies of waveform storage memory can thus be achieved by storing only active waveforms or portions of waveforms.

The silence block may be identified by a hexadecimal 02 in the first byte, and contains the duration of silence (in milliseconds) in the second byte.

The fourth type of segment block 42 is the end-of-list indicator (FIG. 7d). It simply consists of an identification byte such as hexadecimal FF and returns program control to the point where its instruction list was accessed.

4. $\mu$-law companding

Yet another technique may be employed to further compress the speech data, but, unlike the techniques described above, this technique does introduce a certain amount of distortion. The great advantage of this technique is that the amount of extra compaction achieved, and the corresponding amount of distortion introduced, can be incrementally changed by very small amounts, across a very large range, with very little difficulty.

Normal digital encoding consists of encoding waveform amplitude samples into level numbers linearly related to the amplitude of the wave at the sample point. Because the level numbers are integers, and the actual amplitude of the wave usually lies between two integers, the resulting rounding introduces a quantization error. When the digitized waveform is reconverted to analog form, the quantization errors produce a quantization noise.

According to mathematical theory, the ratio of the energy of a linearly digitized signal to the energy of the quantization error, measured in decibels, is six times the number of bits required in the encoding of the signal. Therefore, the level of quantization noise in a waveform whose samples are digitized to twelve bits is 72 db below a full amplitude voice signal.

Instead of using linear encoding, speech signals can be encoded in a quasi-logarithmic fashion so as to increase the signal-to-noise ratio without using extra bits. One such conventional scheme, called the $\mu$-law, encodes values as illustrated in FIG. 8a.

As can be seen in FIG. 8a, small changes of amplitude near the zero-crossing are encoded as relatively much larger differences in digital values. As a matter of fact, the $\mu$-law amplification at the zero crossing is 32:1, simulating a 13-bit encoding within that range. Large values, conversely, are encoded with much less accuracy. It is estimated that the 8-bit $\mu$-law encoding is equivalent to about an 11-bit linear encoding in regard to signal-to-noise ratio. So-called companding digital-to-analog converter (DAC) chips which incorporate the $\mu$-law standard are readily commercially available.

One important consequence of using quasi-logarithmic data instead of linear data is that the peaks in relative frequency of occurrence of sample values about zero are greatly diminished. As a result, the Huffman coding strategy described above does not produce nearly as much compression.

In accordance with the invention, it is possible to achieve any desired trade-off between very low quantization noise (i.e. very high sound quality) but high memory requirements, and high quantization noise but very low memory requirements simply by selecting an appropriate level of logarithmic, linear, or antilogarithmic encoding for the original encoding of the waveform. In the preferred embodiment, the analog speech signal corresponding to the concatenated waveform train is produced by a $\mu$-law companding DAC.

For maximum sound quality, the waveforms are $\mu$-law encoded for storage. Referring again to FIG. 8a, let it be assumed that an analog signal ranging from $-4096$ mV to $4095$ mV is to be $\mu$-law encoded with 8-bit codes representing 256 code levels ($-127$ to $+128$). At the zero crossing of FIG. 8a, standard $\mu$-law companding will produce a one-level code change for each millivolt of signal change—the equivalent of a 13-bit linear encoding. Conversely, at the right and left edges of FIG. 8a a one-level code change corresponds to a 128 mV signal change—the equivalent of a 6-bit linear encoding. The average equivalent for normal speech is about 11-bit; consequently, 8-bit $\mu$-law encoding produces a sound as good as that obtainable by 8-bit linear encoding.

An 8-bit linear encoding of the same signal (FIG. 8b) produces sample values equally spaced by 32 mV. If these values are then converted to $\mu$-law values for application to the $\mu$-law companding DAC, many $\mu$-law code levels near the zero crossing will never be used, while some $\mu$-law codes remote from the zero crossing will be used for several sample values. Thus, this scheme produces an approximately 8-bit accuracy near the zero crossing (where most encoded sample values lie), and approximately a 6-bit accuracy at high signal amplitudes. The average accuracy produced by this encoding in speech applications using a $\mu$-law DAC is only slightly less than eight bits, and the signal-to-noise ratio is therefore on the order of 45 db —still a perfectly satisfactory ratio under most circumstances, without any loss of compression.

The foregoing considerations suggest a further step. The maldistribution of sample values obtainable by using first- and second-order sample differences in a linear encoding scheme is further exacerbated by an anti-logarithmic encoding scheme (FIG. 8c), which is essentially the opposite of $\mu$-law encoding. When the stored samples are originally encoded by an antilogarithmic scheme, the memory required for waveform storage can be reduced even beyond that required with linear encoding.

However, the bit equivalent of the information near the zero crossing (where most of the information lies) rapidly deteriorates as a higher degree of antilogarithmic encoding is used, and the improvement in the outer edges of FIG. 8c falls far short of making up for it. Thus, the limit of compaction in this regard is dictated by the quantization noise (i.e. The bit equivalent) which can be tolerated in any given application.

5. Speech table architecture

In the system of Ser. No. 598,892, the library of instruction lists defining the phonemes and transitions contained P phoneme-defining instruction lists and $P^2$ transition-defining lists so as to provide a transition from every phoneme to every other phoneme. A phoneme table contained pointers to instruction lists used to synthesize the quasi-stationary portion of a phoneme (if it existed), and a transition table contained pointers to instruction lists used to synthesize the rapidly changing sounds in the transition from one phoneme to the next.

For example, in the synthesis of the word "richer", the two tables were alternately consulted to produce a concatenation of waveforms corresponding to the phonetic code string "rIHtSHER", as shown in FIG. 9a. The phoneme information generally consisted of one segment (e.g. one fundamental pitch period) to be repeated a specified number of times as provided by the segment block. The transition information rarely consisted of more than four segments.

In an attempt to simplify the phoneme/transition table, it was first proposed (FIG. 9b) to extend each transition to the center of the phoneme on each side thereof, and to thereby eliminate the phoneme portion of the table. The resulting extended transitions were termed diphones. Although this scheme saved some memory, no instruction list memory was saved because each diphone was unique.

In accordance with the invention (FIG. 9c), diphones can be divided into left and right demi-diphones. The left demi-diphone extends from the mid-point of the previous phoneme to mid-point of the transition into the following phoneme. The right demi-diphone extends from the mid-point of a transition to the mid-point o the following phoneme. It has been found that, unlike the mid-points of phonemes, the mid-points of transitions are not spectrally unique; phonemes can be grouped into "families" based upon the relative compatibility of spectra at the mid-points of transitions. Consequently, left demi-diphones are freely substitutable for other left demi-diphones where the left phonemes are identical and the right phonemes are members of the same right-family; and vice versa. For example, the left demi-diphone in the diphone AE-t is substitutable for that in the diphone AE-d, because t and d are members of the same right-family; similarly, the right demi-diphone in the diphone s-AH is substitutable for that in the diphone t-AH, because s and t are members of the same left-family.

As a result, considerable savings in instruction list memory can be achieved by using the same demi-diphone for several diphones. Therefore, in accordance with the invention, two tables (left and right) of $P^2$ demi-diphones are provided and consulted alternatively by the program. The additional memory required by the second demi-diphone table is far more than compensated for by the reduced number of segment blocks which need to be stored in the instruction list memory.

6. Harmonic distortion reduction

A substantial amount of high-frequency, harmonic distortion is generated any time an abrupt, discontinuous jump in instantaneous voltage occurs in an audio waveform. There are two sources of such discontinuities in the system of Ser. No. 598,892. One is the concatenation of speech segments from different demi-diphones; in general, a randomly-selected waveform will not end at the same level as where another one begins. The second source is the truncation of samples from the end of a voiced pitch period in order to raise the pitch of a sound. By adding a ramp into the waveform, the discontinuities can be eliminated.

Figure 10A:
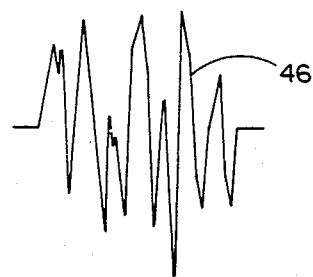
FIG. 10a is a time-amplitude diagram illustrating the ramping of a discontinuous waveform to reduce harmonic distortion.

As shown in FIG. 10a, this ramping is accomplished as follows: After computing any waveform from the stored sample values, the first sample of the new waveform is algebraically subtracted from the last sample of the preceding waveform. If the difference is positive, each sample of the new waveform 62 is increased by $$I = D - ni$$

where
- I = increase of a given sample;
- D = difference between first and last previous sample;
- n = sample number; and
- i = predetermined increment, to form an altered new. waveform 64 which does not have a discontinuity at its junction 66 with the old waveform 68.

When I reaches 0, no further modification of the new waveform samples is performed. If D is negative, i is also negative, the the new waveform samples are decreased by I.

Figure 10B:
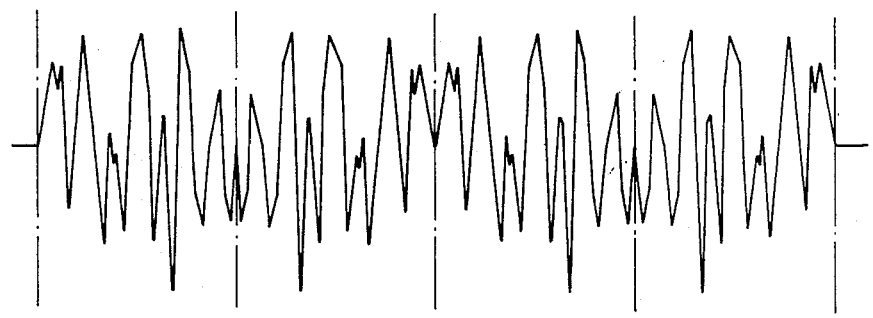
Figure 10C:
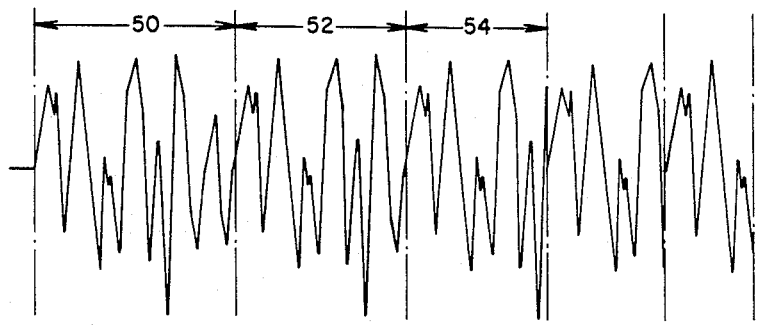

Although the method described above involves the ramping of the beginning of a waveform by adding the ramping signal 70 of FIG. 10b, the same procedure (in reverse) can be used to ramp the end of a waveform by adding thereto the ramping signal 72 of FIG. 10c, or a combination of both can be used as shown in FIG. 10d.

7. Speed Control

In order to simulate the natural stress patterns of ordinary speech, a synthesizer must be able to lengthen and shorten the duration of individual phonemes. Also, by lengthening or shortening all phonemes as a group, the user is able to establish a comfortable overall speed level for speech output. In addition, in the system of Ser. No. 598,892, it is necessary, in order to maintain a constant speed, to compensate automatically for the effect of pitch changes. The system of Ser. No. 598,892 lengthens or shortens the wavelengths of individual pitch periods to bring about changes in the fundamental frequency (pitch), which has a global effect of lengthening or shortening phoneme duration.

The stored waveforms in the system of Ser. No. 598,842 are all about the same length, i.e. The wavelength of the average fundamental pitch frequency of an average human voice. Therefore, if a typical human pitch frequency is 400 Hz, the system of Ser. No. 598,892 will produce about 400 waveforms per second. These waveforms are concatenated as necessary to form the speech.

Figure 13A:
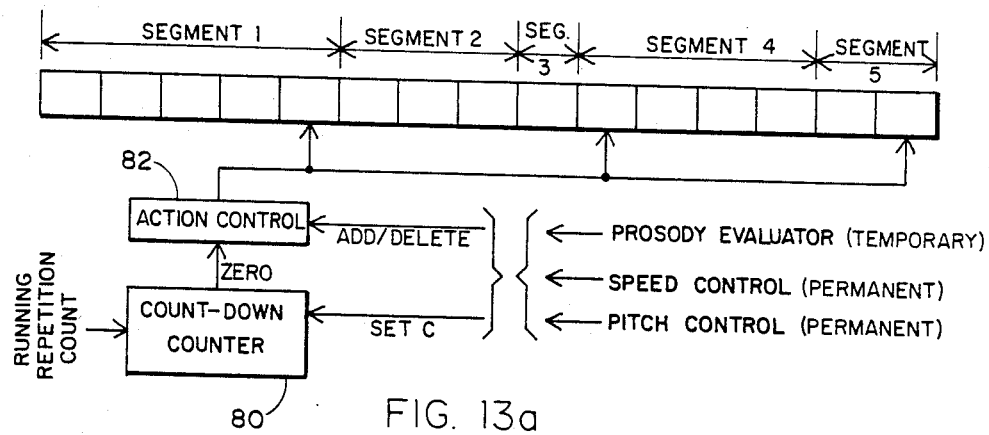
Figure 13B:
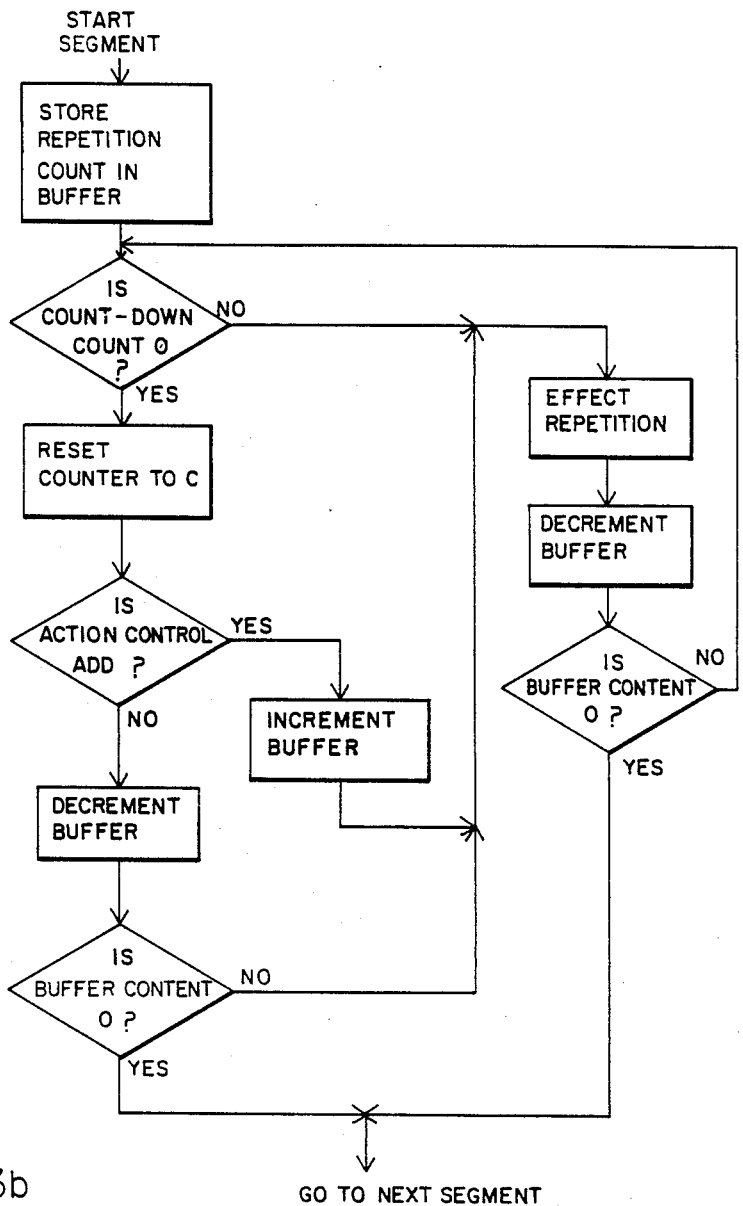
Figure 14A:
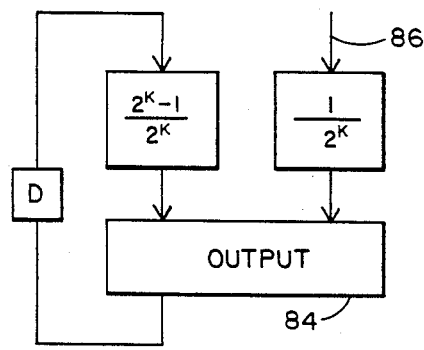
Figure 14B:
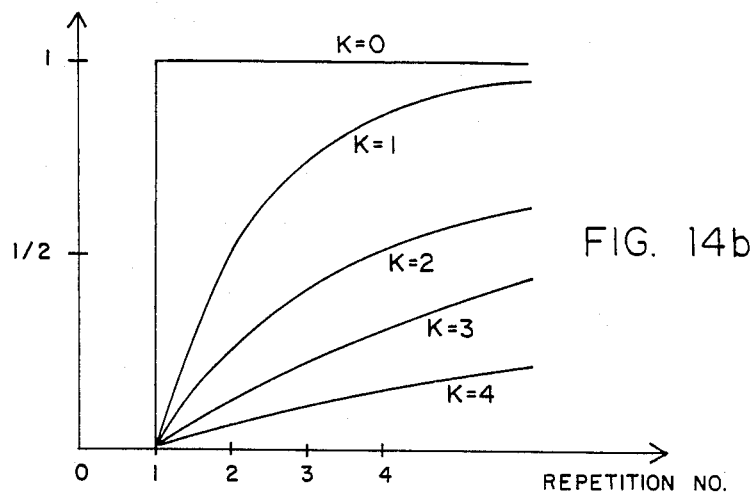
Figure 14C:
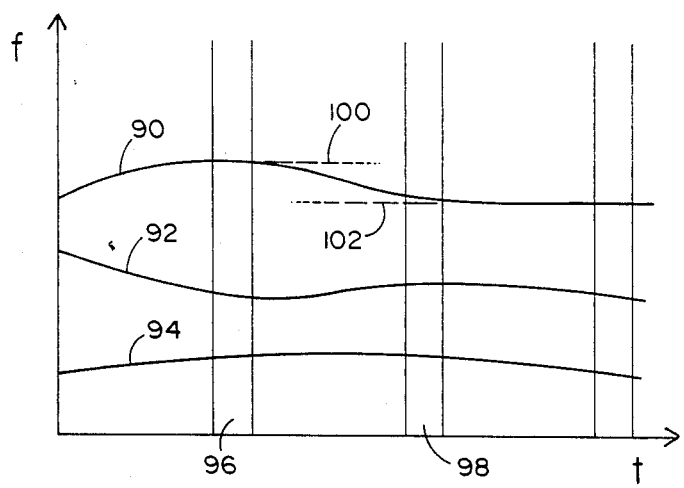

In accordance with the present invention, the speed of the speech can be slowed, or a demi-diphone lengthened, without affecting the pitch (or, conversely, the pitch can be raised without affecting the speed) by providing an adjustable action counter 80 (FIG. 13a) which causes every cth waveform to be repeated, resulting in speech which is slower by a factor of $(c+1)/c$. The value of c is dynamically controlled by the prosody elevaluator and by the speed and pitch controls of the system of Ser. No. 598,892.

Similarly, the speech can be speeded up, an individual demi-diphone can be shortened, or the pitch can be lowered without affecting the speech, by deleting every cth waveform (c being >2). Within wide limits, the repetition or deletion of a single waveform in a series of waveforms causes no significant deterioration in the quality of the speech because the spectra of adjacent concatenated waveforms are usually quite close.

Figure 11A:
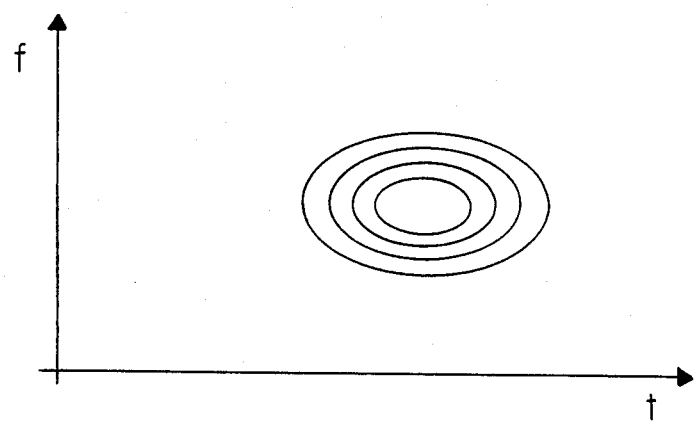
FIGS. 11a and b are diagrams illustrating a speech control system according to the invention.
Figure 11B:
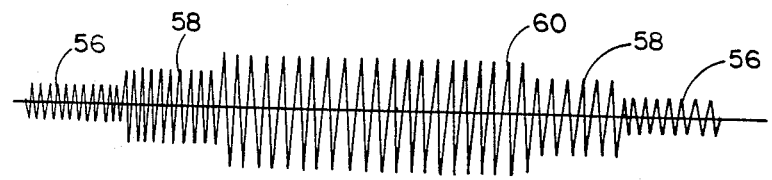
Figure 12A:
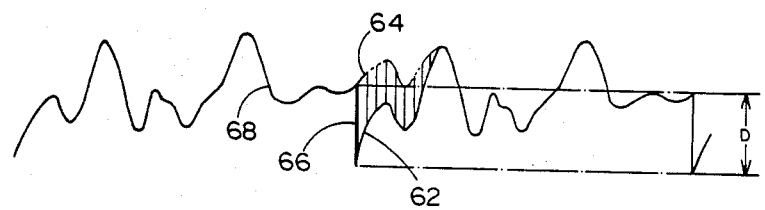
Figure 12B:
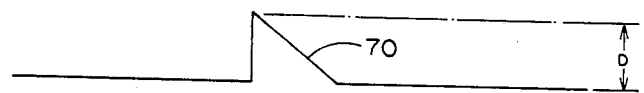
Figure 12C:
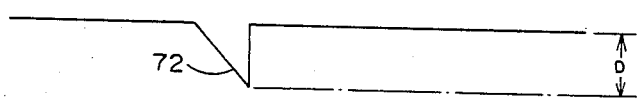
Figure 12D:
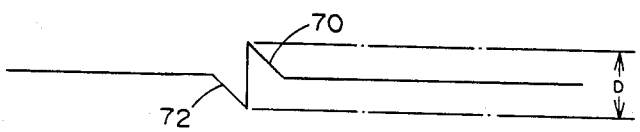

As shown in FIG. 11a, the repetition or deletion of a waveform is best accomplished by sequentially counting each waveform as the instruction list progresses through its segments. The action counter 80 is initialized to the value c, and is decremented by 1 for each waveform being concatenated. Each time the countdown action counter 80 hits zero, it resets to c, and the action control 82 either repeats the previous waveform or deletes the next (depending upon the prosody, speed and pitch inputs). This sequence of operation is illustrated in the flow chart of FIG. 11b.

Figure 15:
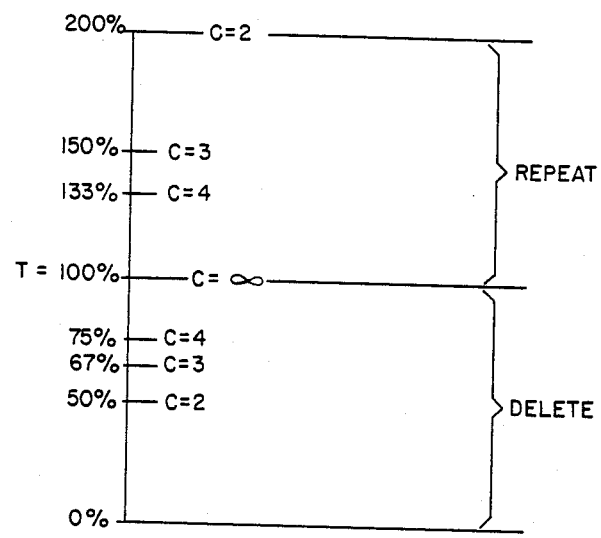
Figure 16:
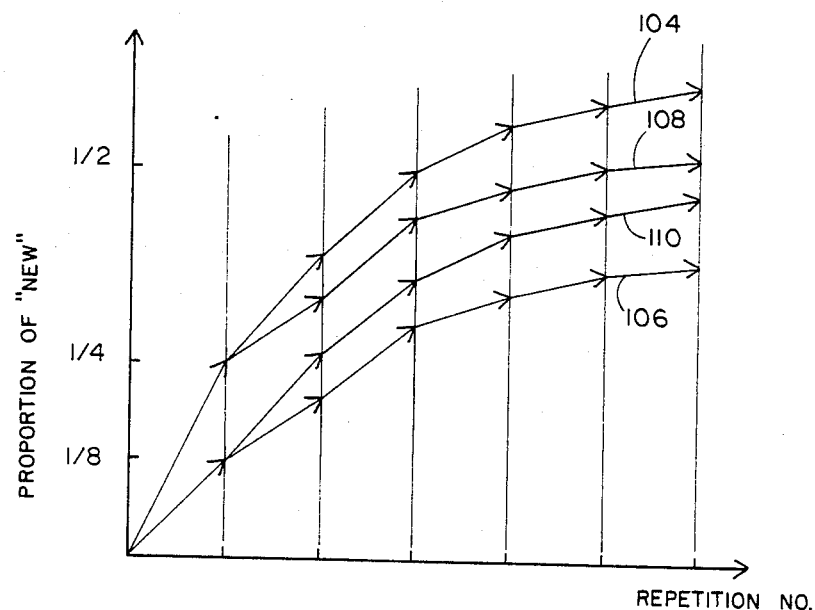

The speed control which can be accomplished by the apparatus of FIG. 11a is quite substantial. If $c = \infty$ (actually, the action control 82 turned off) is taken as the norm, at which a given sentence is spoken in T seconds (FIG. 15), then setting c to 2 and the action control to "delete" will result in the sentence being spoken in 50% of T seconds. This requires every other repetition to be deleted—a requirement which has surprisingly little effect on speech quality in practice.

Conversely, setting c to 1 and the action control to "repeat" causes every waveform to be repeated, so that the sentence is spoken in 200% of T seconds. With c=2, the sentence is spoken in 150% of T.

It will be noted that at low values of c, the speed adjustments obtained by varying c by full integers are extremely coarse. Consequently, in the preferred embodiment of the invention, waveform repetition and deletion involves the use of fractional c's.

The action counter 80, in the preferred embodiment, may for example, be preset to 27/16. Each concatenated waveform decrements the counter 80 by 1. When the count is 0 or negative, a deletion or repetition action is taken by the action control 82, and any negative count is algebraically added to the reset value of 27/16. For successive waveforms, the decremented count in counter 80 would thus proceed as follows from the original preset count of 27/16:

| Waveform No. | Count (in sixteenths) | Reset to (in sixteenths) | Action (delete or repeat) | Action No. |
| --- | --- | --- | --- | --- |
| 1 | 11 | | | |
| 2 | −5 | 22 | X | 1 |
| 3 | 6 | | | |
| 4 | −10 | 17 | X | 2 |
| . | . | . | . | . |
| . | . | . | . | . |
| . | . | . | . | . |
| 24 | 6 | 21 | X | 14 |
| 25 | 5 | | | |
| 26 | −11 | 16 | X | 15 |
| 27 | 0 | 27 | X | 16 |

It will be seen that setting c=27/16 produces sixteen deletions or repetitions for each twenty-seven waveforms. In the case of repetitions, this slows the speech to where the enunciation of a given sentence requires approximately 160% of the time required in the absence of speed control.

SUMMARY

The present invention, when used together with the teachings of application Ser. No. 598,892, provides a highly efficient text-to-speech conversion system capable of producing high-quality speech at selectable speeds and pitches with a minimum amount of memory.

I claim:
1. In a real-time text-to-speech conversion system in which waveforms are encoded for storage in terms of digital samples, the frequency of occurrence of the various possible sample levels being non-uniform, the improvement comprising encoding corresponding samples of a pair of successive waveforms for storage by a Huffman coding in which the sample values themselves are encoded for the first waveform of said pair, and the value of the difference between each sample and the corresponding sample of said first waveform is encoded for the second waveform of said pair.

2. The improvement of claim 1, in which the shortest codes of said Huffman coding represent the sample or difference values occurring most frequently in said pair of waveforms.

3. The improvement of claim 2, in which, when said first and second waveforms have different numbers of samples, the shorter waveform is treated in the computation of said difference values as if it were padded with sufficient zero value samples to equal the number of samples in the longer waveform.

* * * * *